(12) United States Patent
Hosotani et al.

(10) Patent No.: US 12,516,451 B2
(45) Date of Patent: Jan. 6, 2026

(54) PRODUCTION METHOD FOR PRECARBONIZED FIBER BUNDLE, PRODUCTION METHOD FOR CARBON FIBER BUNDLE, AND PRECARBONIZATION FURNACE

(71) Applicant: Toray Industries, Inc., Tokyo (JP)

(72) Inventors: Naoto Hosotani, Ehime (JP); Takamitsu Hirose, Ehime (JP); Takuya Kataoka, Ehime (JP)

(73) Assignee: Toray Industries, Inc., Tokyo (JP)

( * ) Notice: Subject to any disclaimer, the term of this patent is extended or adjusted under 35 U.S.C. 154(b) by 645 days.

(21) Appl. No.: 17/908,578

(22) PCT Filed: Mar. 22, 2021

(86) PCT No.: PCT/JP2021/011679
§ 371 (c)(1),
(2) Date: Sep. 1, 2022

(87) PCT Pub. No.: WO2021/193520
PCT Pub. Date: Sep. 30, 2021

(65) Prior Publication Data
US 2024/0035205 A1   Feb. 1, 2024

(30) Foreign Application Priority Data
Mar. 24, 2020   (JP) .................... 2020-052291

(51) Int. Cl.
*D02J 13/00*   (2006.01)
*D01D 10/04*   (2006.01)
(Continued)

(52) U.S. Cl.
CPC .......... *D01F 9/22* (2013.01); *D01D 10/0436* (2013.01); *D01D 10/0463* (2013.01);
(Continued)

(58) Field of Classification Search
CPC .......... D01D 10/0436; D01D 10/0463; D01D 10/0481; D01F 9/14; D01F 9/20;
(Continued)

(56) References Cited

U.S. PATENT DOCUMENTS

2007/0196648 A1* 8/2007 Endo ................ D01F 9/225
428/292.1
2016/0369427 A1   12/2016 Mizuno et al.

FOREIGN PATENT DOCUMENTS

CN   104611785 A   5/2015
JP   4835122 A   5/1973
(Continued)

OTHER PUBLICATIONS

International Search Report and Written Opinion for International Application No. PCT/JP2021/011679, dated Jun. 8, 2021, 7 pages.
(Continued)

*Primary Examiner* — Leo B Tentoni
(74) *Attorney, Agent, or Firm* — Buchanan Ingersoll & Rooney PC

(57) ABSTRACT

An object is to provide a production method for a precarbonized fiber bundle and a precarbonization furnace capable of continuously producing the precarbonized fiber bundle for a long period of time by efficiently discharging a decomposition gas containing a tar component generated when performing a precarbonization treatment at the time of carbon fiber production and retained in a heat treatment chamber throughout the heat treatment chamber. The production method for a precarbonized fiber bundle includes allowing an aligned stabilized fiber bundle vertically arranged in one or two or more tiers to travel horizontally in a heat treatment chamber and heat-treating and precarbonizing the stabilized fiber bundle at a maximum temperature of 300 to 1,000° C. using an inert gas supplied from an inlet side and an outlet side of the heat treatment chamber, in
(Continued)

which a flow rate ratio $Q2/Q1$ satisfies Formula (1) below, where $Q1$ represents a volume flow rate of gas in a first exhaust discharged out of the heat treatment chamber from a position higher than a position of an uppermost tier of the traveling stabilized fiber bundle, and $Q2$ represents a volume flow rate of gas in a second exhaust discharged out of the heat treatment chamber from a position lower than the position of the uppermost tier of the traveling stabilized fiber bundle:

$$0.01 \leq Q2/Q1 \leq 0.5 \quad \text{Formula (1).}$$

7 Claims, 10 Drawing Sheets

(51) Int. Cl.
  *D01F 9/22* (2006.01)
  *D01F 9/32* (2006.01)
  *F27B 9/28* (2006.01)
  *F27D 7/02* (2006.01)
(52) U.S. Cl.
  CPC ......... *D01D 10/0481* (2013.01); *D01F 9/225* (2013.01); *D01F 9/32* (2013.01); *D02J 13/001* (2013.01); *D02J 13/008* (2013.01); *F27B 9/28* (2013.01); *F27D 7/02* (2013.01)

(58) Field of Classification Search
  CPC .. D01F 9/22; D01F 9/225; D02J 13/00; D02J 13/001; D02J 13/008
  USPC .......... 264/29.2, 29.6, 345; 423/447.1, 447.7
  See application file for complete search history.

(56) References Cited

FOREIGN PATENT DOCUMENTS

| | | | |
|---|---|---|---|
| JP | 58115119 | A | 7/1983 |
| JP | 62243831 | A | 10/1987 |
| JP | 03220321 | A | 9/1991 |
| JP | 11173761 | A | 7/1999 |
| JP | 2002294521 | A | 10/2002 |
| JP | 2007262602 | A | 10/2007 |
| JP | 4241950 | B2 | 3/2009 |
| JP | 2012207323 | A | 10/2012 |
| WO | 2015002202 | A1 | 1/2015 |

OTHER PUBLICATIONS

Extended European Search Report issued Feb. 10, 2025, by the European Patent Office in corresponding European Patent Application No. 21775771.5 - 1102. (11 pages).

* cited by examiner

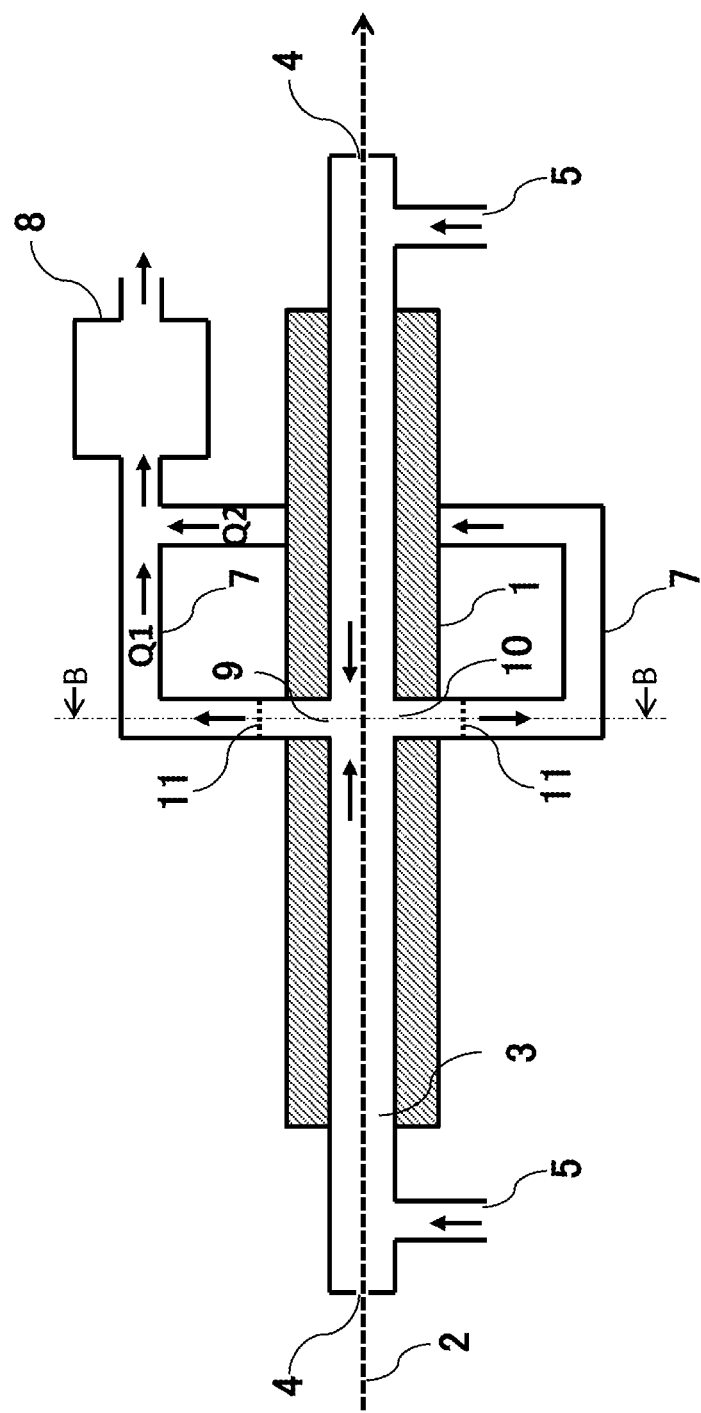
[FIG.1]

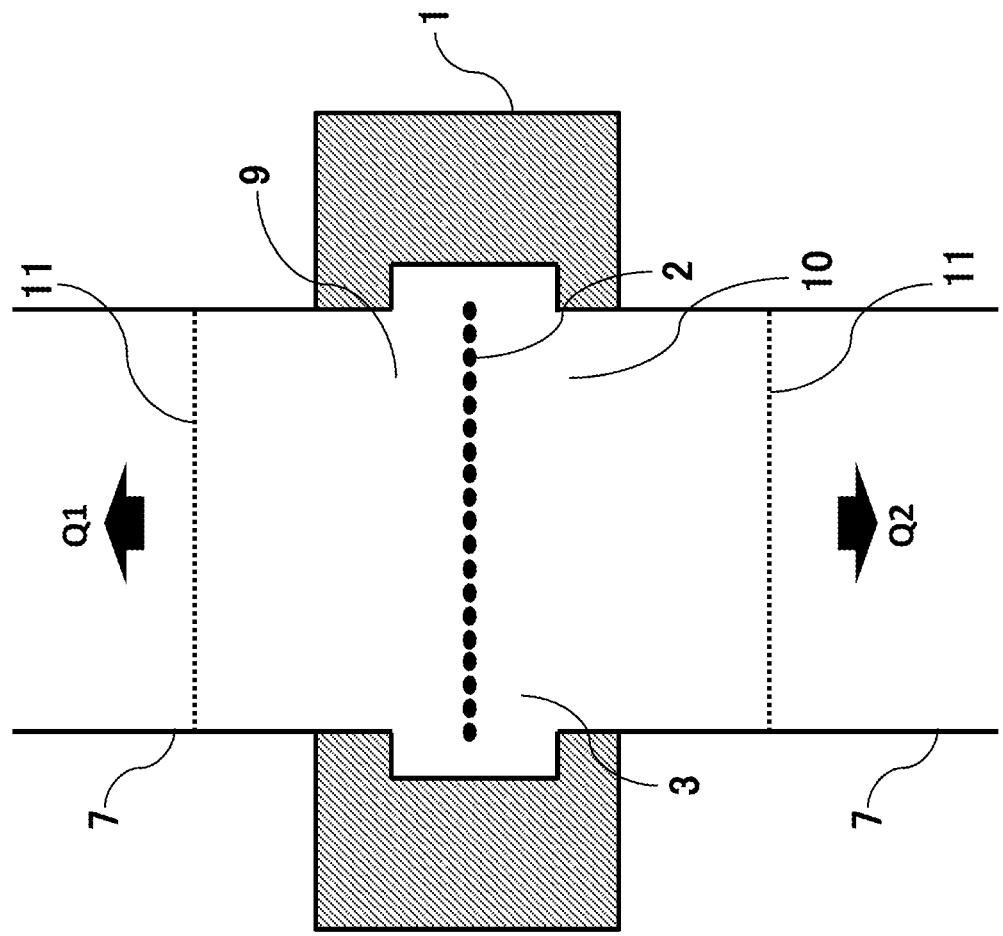
[ FIG. 2 ]

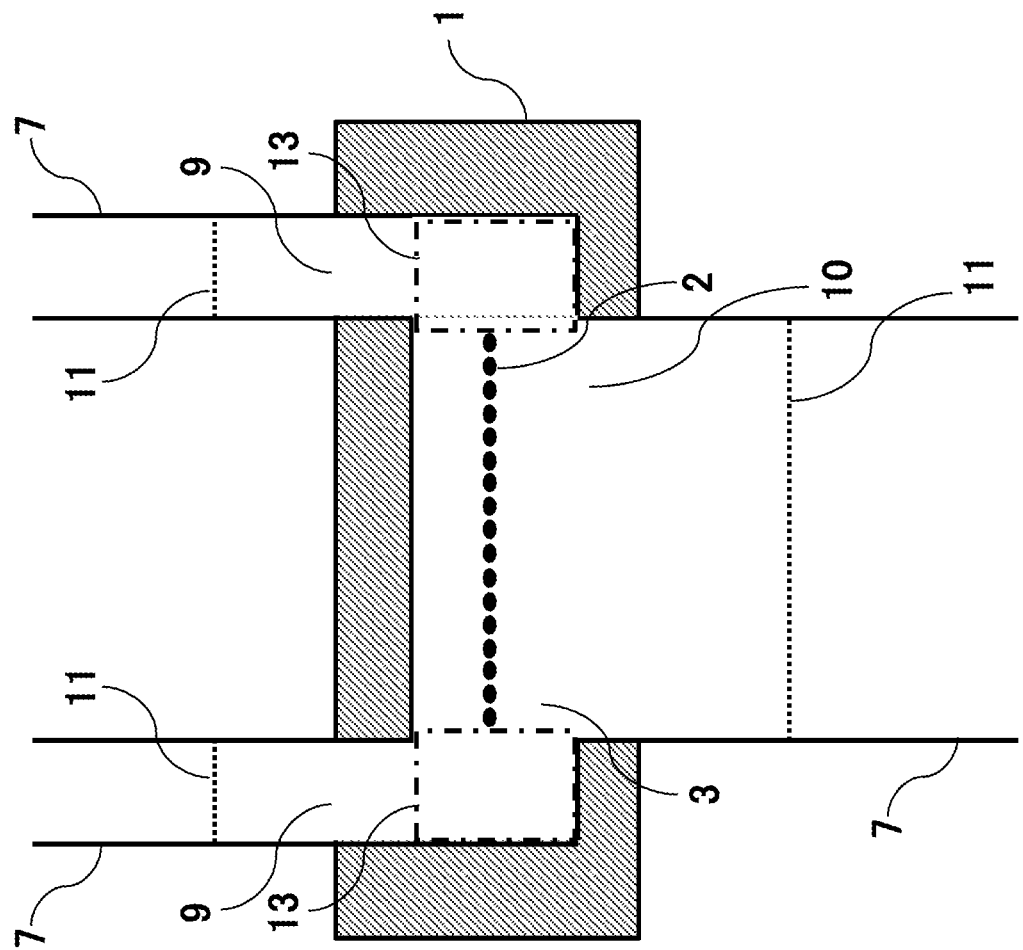
[FIG.3]

[FIG.4]
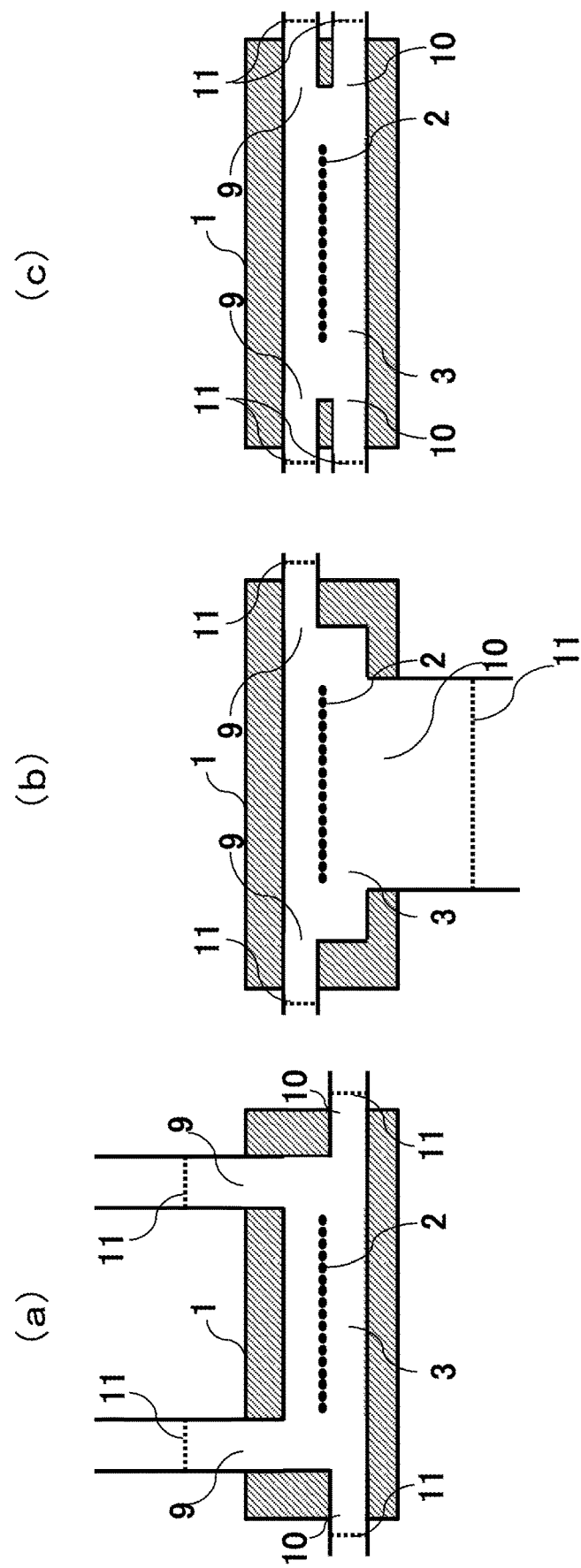

[FIG.5]
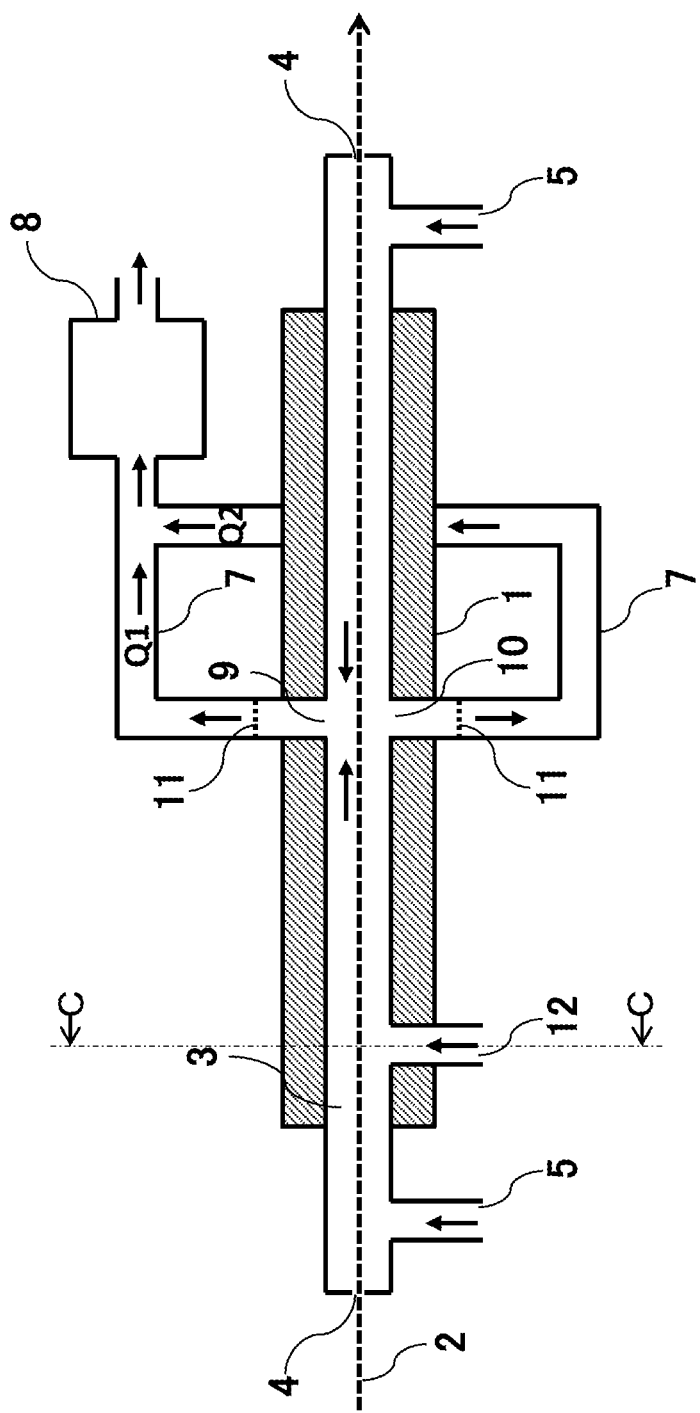

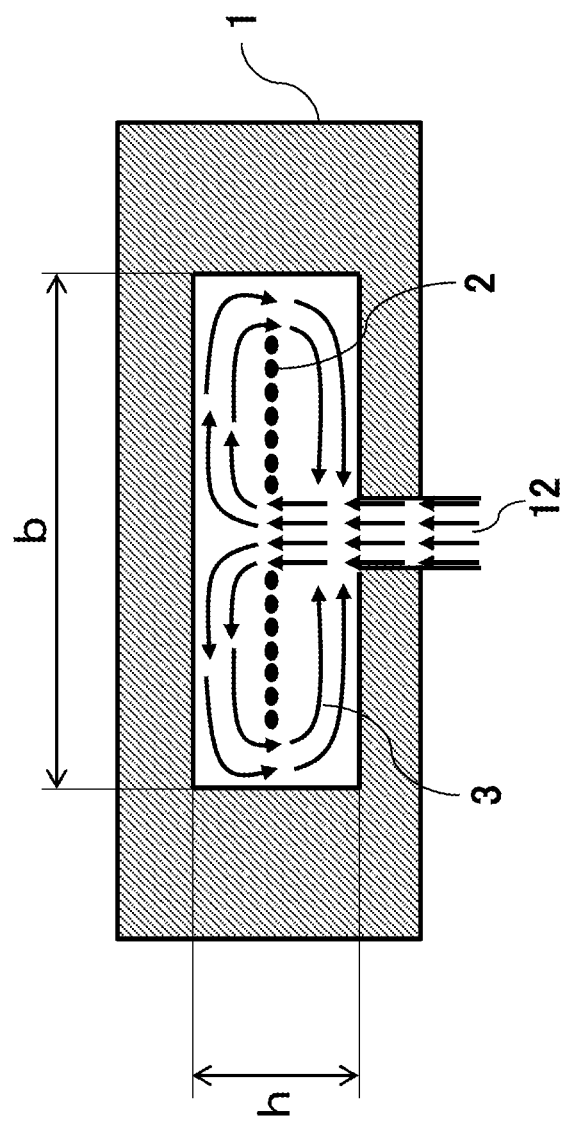
[FIG.6]

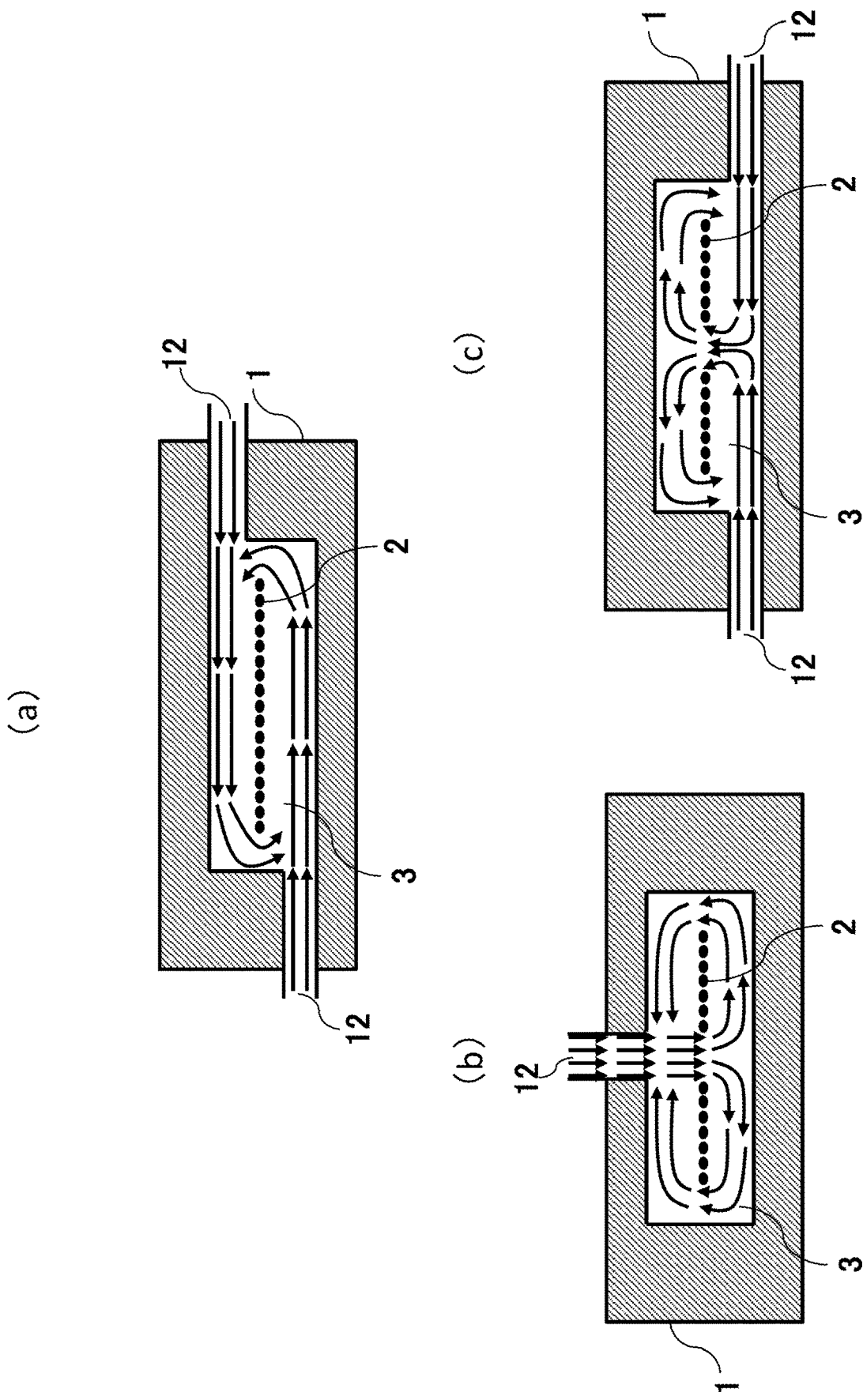

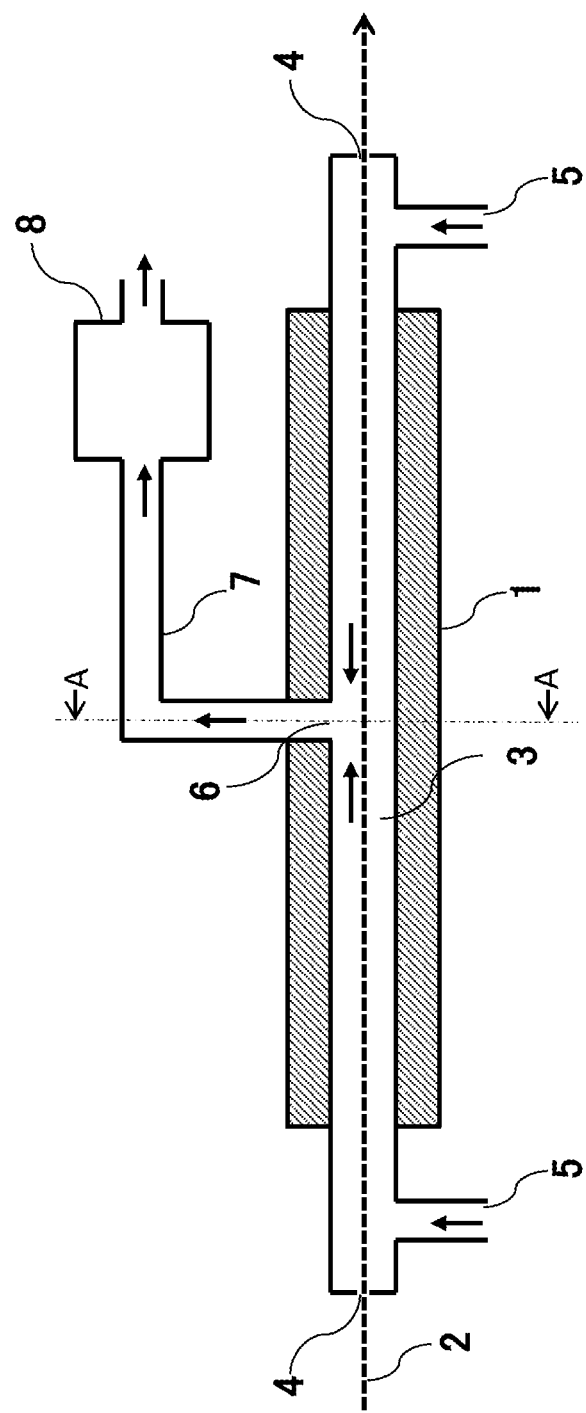

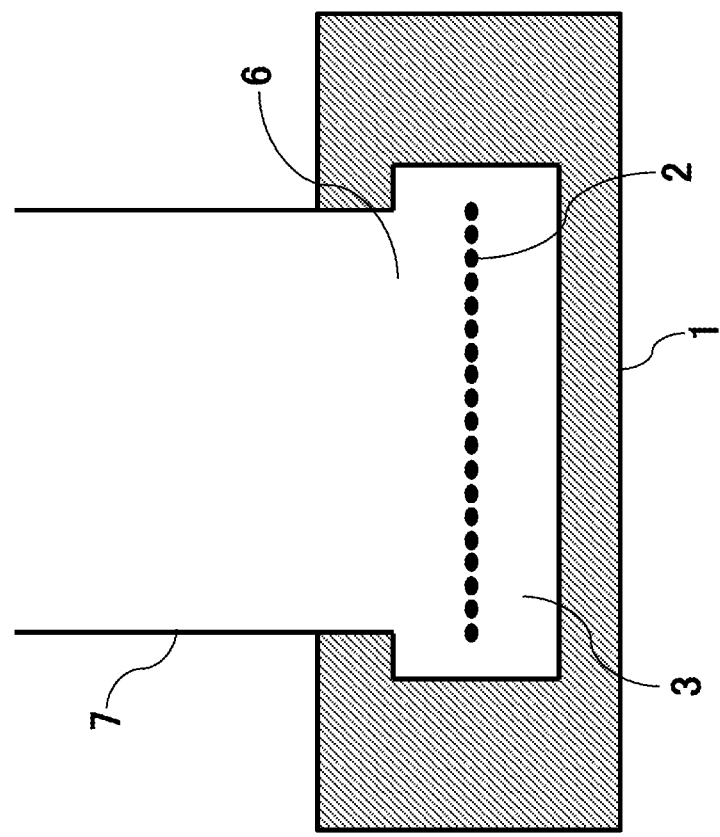
[FIG.9]

[FIG.10]
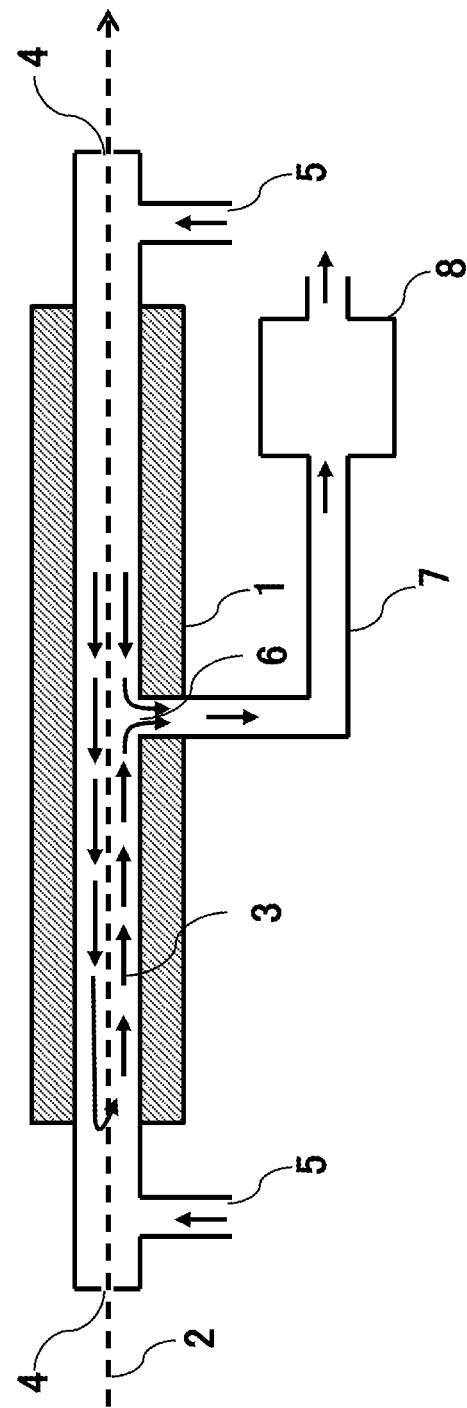

PRODUCTION METHOD FOR PRECARBONIZED FIBER BUNDLE, PRODUCTION METHOD FOR CARBON FIBER BUNDLE, AND PRECARBONIZATION FURNACE

CROSS REFERENCE TO RELATED APPLICATIONS

This is the U.S. National Phase application of PCT/JP2021/011679, filed Mar. 22, 2021, which claims priority to Japanese Patent Application No. 2020-052291, filed Mar. 24, 2020, the disclosures of each of these applications being incorporated herein by reference in their entireties for all purposes.

FIELD OF THE INVENTION

The present invention relates to a production method for a precarbonized fiber bundle and a precarbonization furnace capable of continuously producing the precarbonized fiber bundle for a long period of time by efficiently discharging a decomposition gas containing a tar component retained in a heat treatment chamber throughout the heat treatment chamber when performing a precarbonization treatment at the time of carbon fiber production.

BACKGROUND OF THE INVENTION

Since carbon fibers are excellent in specific strength, specific elastic modulus, heat resistance, and chemical resistance, they are useful as reinforcing materials for various materials and are used in a wide range of fields such as aerospace applications, leisure applications, and general industrial applications.

In general, as a method for producing a carbon fiber bundle from an acrylic fiber bundle, there is known a method in which (i) a fiber bundle obtained by bundling thousands to tens of thousands of single fibers of an acrylic polymer is fed into a stabilization furnace and heat-treated (stabilization-treated) by exposing the fiber bundle to hot air in an oxidizing atmosphere such as air heated to 200 to 300° C. supplied from a hot air supply nozzle installed in the furnace, and subsequently, (ii) the obtained stabilized fiber bundle is fed into a precarbonization furnace, heat-treated (precarbonized) in an inert gas atmosphere of 300 to 1,000° C., and then (iii) further heat-treated (carbonized) in a carbonization furnace filled with an inert gas atmosphere of 1,000° C. or higher. In addition, the stabilized fiber bundle as an intermediate material is also widely used as a material for a flame-retardant woven fabric by taking advantage of its flame-retardant performance.

In the precarbonization furnace in the above (ii), gasified decomposition products such as HCN, $NH_3$, $N_2$, $H_2O$, $CO_2$, and tar are generated from the fiber bundle to be treated along with carbonization, and thus it is common to provide a gas discharge port for discharging these decomposition products in the furnace. Among these decomposition products, in particular, the tar component sticks to the inner wall of the heat treatment chamber, and when the tar component is accumulated in a certain amount or more, the tar component falls on the traveling stabilized fiber bundle, resulting in deterioration in physical properties, an increase in fuzz, occurrence of yarn breakage, and the like, leading to deterioration in quality and a decrease in producibility of the obtained carbon fiber. In addition, there is the problem that the tar component is accumulated on the inner wall of a duct from an exhaust port to an apparatus for decomposing or combusting the exhaust gas to block the line, and the continuous production period is shortened.

In order to solve these problems, Patent Document 1 discloses that the exhaust gas can be smoothly discharged by forming an exhaust port on an upper wall surface of a heat treatment chamber at a position where the temperature setting in the heat treatment chamber is the maximum temperature, a position where the vaporized tar component is not condensed in the furnace, or a position that is within such a temperature region that a large amount of tar component is generated from the stabilized fiber bundle.

Further, Patent Document 2 discloses that by providing one or more exhaust ports on a side wall of a heat treatment chamber and providing the exhaust ports so as to be biased in a region higher than the traveling height of the traveling stabilized fiber bundle, contamination of the stabilized fiber bundle can be prevented by preventing gas containing the tar component staying in the furnace from sticking, being accumulated, and falling on the traveling stabilized fiber bundle from an upper wall surface of the heat treatment chamber.

PATENT DOCUMENTS

Patent Document 1: Japanese Patent Laid-open Publication No. 2002-294521
Patent Document 2: Japanese Patent Laid-open Publication No. 2012-207323

SUMMARY OF THE INVENTION

However, according to findings by the present inventors, in Patent Document 1, it is not possible to completely prevent the tar component from adhering to the vicinity of the exhaust port on the upper wall surface of the heat treatment chamber, and thus it is necessary to frequently clean the exhaust port so that the stuck tar component will not fall on the fiber bundle to be treated.

In addition, the exhaust method disclosed in Patent Literature 2 is effective for discharging the decomposition gas staying in a region higher than the traveling region of the stabilized fiber bundle, but it is expected that the discharging efficiency of the gas staying in a region lower than the traveling region of the stabilized fiber bundle will be low. The method is therefore not effective for discharging the gas containing the tar component in the entire furnace.

Therefore, an object of the present invention is to provide a production method for a precarbonized fiber bundle and a precarbonization furnace capable of continuously producing the precarbonized fiber bundle for a long period of time by efficiently discharging a decomposition gas containing a tar component generated when performing a precarbonization treatment at the time of carbon fiber production and retained in a heat treatment chamber throughout the heat treatment chamber.

For solving the above-described problems, a production method for a precarbonized fiber bundle according to embodiments of the present invention has the following configuration. That is, the production method for a precarbonized fiber bundle includes allowing a stabilized fiber bundle aligned along a horizontal plane and vertically arranged in one or two or more tiers to travel horizontally in a heat treatment chamber and heat-treating and precarbonizing the stabilized fiber bundle at a maximum temperature of 300 to 1,000° C. using an inert gas supplied from an inlet side and an outlet side of the heat treatment chamber, in which a flow rate ratio Q2/Q1 satisfies Formula (1) below, where Q1 represents a volume flow rate of gas in a first exhaust discharged out of the heat treatment chamber from a position higher than a position of an uppermost tier of the traveling stabilized fiber bundle, and Q2 represents a volume flow rate of gas in a second exhaust discharged out of the heat treatment chamber from a position lower than the position of the uppermost tier of the traveling stabilized fiber bundle.

$$0.01 \leq Q2/Q1 \leq 0.5 \quad \text{Formula (1)}$$

In addition, the production method for a carbon fiber bundle according to embodiments of the present invention has the following configuration. That is, the production method for a carbon fiber bundle includes subjecting a precarbonized fiber bundle obtained by the production method for a precarbonized fiber bundle described above to a carbonization treatment at a maximum temperature of 1,000 to 2,000° C. in an inert gas.

Further, the precarbonization furnace according to embodiments of the present invention has the following configuration. That is, the precarbonization furnace includes a heat treatment chamber configured to be used for precarbonization by heat-treating a stabilized fiber bundle aligned along a horizontal plane and vertically arranged in one or two or more tiers at a maximum temperature of 300 to 1,000° C. in an inert gas while the stabilized fiber bundle is traveling horizontally to provide a precarbonized fiber bundle, slit-shaped openings through which the stabilized fiber bundle is carried into the heat treatment chamber and the precarbonized fiber bundle is carried out of the heat treatment chamber, inert gas supply ports respectively provided on an inlet side of the stabilized fiber bundle and an outlet side of the precarbonized fiber bundle and configured to supply the inert gas into the heat treatment chamber, a first exhaust port provided at a position higher than a position of an uppermost tier of the traveling stabilized fiber bundle, a second exhaust port provided at a position lower than the position of the uppermost tier of the traveling stabilized fiber bundle, and a mechanism configured to adjust a flow rate ratio Q2/Q1, where Q1 represents a volume flow rate of gas discharged from the first exhaust port, and Q2 represents a volume flow rate of gas discharged from the second exhaust port.

The present invention according to various embodiments enables continuous production of a precarbonized fiber bundle for a long period of time by efficiently discharging a decomposition gas containing a tar component generated when performing a precarbonization treatment at the time of carbon fiber production and retained in a heat treatment chamber throughout the heat treatment chamber.

BRIEF DESCRIPTION OF THE DRAWINGS

FIG. 1 is a schematic cross-sectional view of a precarbonization furnace used in an embodiment of the present invention.

FIG. 2 is a cross-sectional view taken along the line B-B of FIG. 1 as viewed in the direction of the arrows.

FIG. 3 is a cross-sectional view showing another example of the arrangement of first exhaust ports.

FIG. 4 is a cross-sectional view showing still other examples of the arrangement of the first exhaust ports.

FIG. 5 is a schematic cross-sectional view of a precarbonization furnace used in another embodiment of the present invention.

FIG. 6 is a cross-sectional view taken along the line C-C of FIG. 5 as viewed in the direction of the arrows.

FIG. 7 is a cross-sectional view showing other examples of the arrangement of additional inert gas supply ports.

FIG. 8 is a schematic cross-sectional view of a conventional precarbonization furnace.

FIG. 9 is a cross-sectional view taken along the line A-A of FIG. 8 as viewed in the direction of the arrows.

FIG. 10 is a schematic cross-sectional view of another example of the conventional precarbonization furnace.

DETAILED DESCRIPTION OF EMBODIMENTS OF THE INVENTION

Hereinafter, embodiments of the present invention will be described in detail with reference to FIG. 1 to FIG. 10. Note that the drawings are conceptual diagrams for accurately describing the main points of the present invention and are simplified diagrams. Therefore, the precarbonization furnace used in the present invention is not particularly limited to the aspects shown in the drawings, and its dimensions and the like, for example, can be changed according to an embodiment.

The present invention according to various embodiments provides a production method for a precarbonized fiber bundle in which a stabilized fiber bundle is precarbonized in an inert gas having a maximum temperature of 300 to 1,000° C., the method being performed in a precarbonization furnace in which the inert gas flows. As the inert gas filling the inside of the precarbonization furnace, a known inert gas such as nitrogen, argon, and helium can be employed, but nitrogen is preferable from the viewpoint of economic efficiency. As the stabilized fiber bundle, those obtained by heat-treating an acrylic fiber bundle in an oxidizing gas are preferably used in the present invention.

First, a conventionally used precarbonization furnace will be described with reference to FIG. 8. Arrows in the drawings indicate flows of inert gas or exhaust gas in a heat treatment chamber. A precarbonization furnace 1 includes a heat treatment chamber 3 for heat-treating a stabilized fiber bundle 2 traveling in the horizontal direction in an inert gas, and the stabilized fiber bundle 2 is carried in/out through slit-shaped openings 4 provided in the heat treatment chamber 3. Although not illustrated in the drawings, those having a sealing mechanism such as a labyrinth seal structure are preferably used in order to prevent inflow of oxygen and the like into the heat treatment chamber. The stabilized fiber bundle 2 has a wide sheet-shaped form in which a plurality of fibers are aligned side by side in a direction perpendicular to the paper plane. While traveling in the heat treatment chamber 3, the stabilized fiber bundle 2 is heat-treated with the inert gas supplied from inert gas supply ports 5 provided on both the inlet side and outlet side of the heat treatment chamber. The supplied inert gas and the decomposition gas generated from the stabilized fiber bundle 2 along with carbonization are extracted from an exhaust port 6 formed in the heat treatment chamber, passed through an exhaust duct 7, and sent to a combustion or exhaust gas treatment device 8 for combustion or decomposition treatment. Although the inert gas supply ports are provided on the bottom surface side of the heat treatment chamber in the drawing, the inert gas supply ports may be provided on the upper surface side, or the supply may be performed from a plurality of places instead of one place on each of the inlet side and the outlet side.

The precarbonization furnace used in the precarbonization treatment according to embodiments of the present invention is used at a maximum temperature of 300 to 1,000° C., and a precarbonization furnace having such a temperature distribution that the temperature sequentially becomes higher from an inlet port toward an outlet port of the stabilized fiber bundle 2 is more preferably used. In this precarbonization furnace, gasified decomposition products such as HCN, $NH_3$, $N_2$, $H_2O$, $CO_2$, and tar are generated from the fiber bundle to be treated as the stabilized fiber bundle 2 is carbonized. Among these decomposition products, it is known that the tar component sticks to the inner wall of the heat treatment chamber. FIG. 9 is a cross-sectional view taken along the line A-A of FIG. 8 as viewed in the direction of the arrows. When a decomposition gas containing the tar component is discharged from the exhaust port 6 provided on the upper surface of the heat treatment chamber, the tar component sticks to the periphery of the exhaust port 6 and the inner wall of the exhaust duct 7. When a certain amount or more of the tar component is accumulated, the tar component drops onto the traveling stabilized fiber bundle 2, resulting in deterioration in physical properties, an increase in fuzz, occurrence of yarn breakage, and the like, leading to deterioration in quality and a decrease in producibility of the obtained carbon fiber. In addition, since the exhaust from the upper surface of the heat treatment chamber 3 is performed, the exhaust efficiency of the gas staying in a region lower than the stabilized fiber bundle 2 is lowered, and as a result, the tar component sticks and accumulates on the bottom surface of the heat treatment chamber 3, and frequent cleaning is required, so that the production efficiency is lowered.

Next, another conventionally used precarbonization furnace is shown in FIG. 10. FIG. 10 is the same as the precarbonization furnace shown in FIG. 8 except that the exhaust port 6 is provided on the bottom surface of the heat treatment chamber. Although the flow of the inert gas or the exhaust gas is shown as in FIG. 8, in the case where the exhaust port 6 is provided on the bottom surface of the heat treatment chamber, the temperature of the inert gas flowing from the outlet side of the precarbonization furnace is higher than the temperature of the inert gas flowing from the inlet side. Therefore, buoyancy acts due to the density difference, the gas stagnates in the upper part of the furnace, and a flow path is formed through which the exhaust gas containing the tar component flowing from the outlet side once passes by the exhaust port 6, flows into the inlet side, and then flows toward the exhaust port again. At this time, the exhaust gas containing the tar component flowing from the outlet side is exposed to a low-temperature portion on the inlet side, so that the tar component sticks to and accumulates on the inner wall of the heat treatment chamber 3. As a result, as in the case where the exhaust port 6 is provided on the upper surface of the heat treatment chamber 3, the accumulated tar component falls onto the stabilized fiber bundle 2, which not only causes deterioration in quality and a decrease in producibility of the carbon fiber to be obtained but also causes the tar component accumulated on the inner wall of the heat treatment chamber to flow into the exhaust duct 7 and accumulates on the inner wall of the duct, thereby blocking the line and shortening the continuous production period.

Therefore, the present inventors have found that it is difficult to completely prevent the sticking and accumulation of the tar component contained in the decomposition gas only by providing the exhaust port 6 at one of the upper surface and the bottom surface of the heat treatment chamber, that is, at a position higher or lower than the traveling stabilized fiber bundle 2. The production method for a precarbonized fiber bundle according to embodiments of the present invention is made through intensive studies on the above problems and intended to enable continuous production of a high-quality precarbonized fiber bundle for a long period of time.

Hereinafter, the production method for a precarbonized fiber bundle and the precarbonization furnace according to embodiments of the present invention will be described with reference to FIGS. 1 and 2. In an embodiment of the present invention shown in FIGS. 1 and 2, the production method for a precarbonized fiber bundle includes allowing an aligned stabilized fiber bundle vertically arranged in one or more tiers to travel horizontally in a heat treatment chamber and heat-treating and precarbonizing the stabilized fiber bundle at a maximum temperature of 300 to 1,000° C. using an inert gas supplied from an inlet side and an outlet side of the heat treatment chamber, in which a flow rate ratio Q2/Q1 satisfies Formula (1) below, where Q1 represents a volume flow rate of gas in a first exhaust discharged out of the heat treatment chamber from a position higher than the uppermost tier of the traveling stabilized fiber bundle, and Q2 represents a volume flow rate of gas in a second exhaust discharged out of the heat treatment chamber from a position lower than the uppermost tier of the traveling stabilized fiber bundle.

$$0.01 \leq Q2/Q1 \leq 0.5 \quad \text{Formula (1)}$$

Here, the uppermost tier of the stabilized fiber bundle in the present invention refers to a stabilized fiber bundle traveling at the highest position in the height direction of the heat treatment chamber. In FIG. 2, since the traveling stabilized fiber bundle 2 is in one tier in the height direction of the heat treatment chamber, the uppermost tier of the stabilized fiber bundle is the illustrated stabilized fiber bundle 2 itself. For example, when the stabilized fiber bundle is made to travel in a plurality of tiers in the height direction (vertical direction) of the heat treatment chamber, the first and second exhaust ports are provided with the uppermost tier of the traveling stabilized fiber bundle, that is, the stabilized fiber bundle 2 traveling at the highest position in the height direction of the heat treatment chamber, as a reference height.

The precarbonization furnace used in the precarbonization treatment of the present invention is used at a maximum temperature of 300 to 1,000° C., and a precarbonization furnace having such a temperature distribution that the temperature sequentially becomes higher from an inlet port toward an outlet port of the stabilized fiber bundle 2 is more preferably used.

According to the study of the present inventors, as will be apparent from examples described later, by setting the flow rate ratio between the volume flow rates Q1 and Q2 of the discharged gas to be in the above-described range, it is possible to reduce the sticking and accumulation of the tar component contained in the decomposition gas, which has been a problem in the prior art, as much as possible in the entire heat treatment chamber and to continuously produce a high-quality precarbonized fiber bundle for a long period of time.

Furthermore, in order to enable continuous operation for a long time, it is preferable that the flow rate ratio Q2/Q1 of the volume flow rate Q1 of the gas in the first exhaust and the volume flow rate Q2 of the gas in the second exhaust satisfies Formula (2) below.

$$0.01 \leq Q2/Q1 \leq 0.3 \quad \text{Formula (2)}$$

As a result, it is possible to minimize the sticking and accumulation of the tar component, and the production efficiency is improved.

Here, as a method for adjusting the volume flow rates Q1 and Q2 of the gases discharged from the respective exhaust ports, the pressure loss may be changed to perform the adjustment by changing the length of each exhaust duct or changing the cross-sectional area by providing an orifice plate or the like. However, more simply, it is preferable to install a regulating valve 11 such as a damper and appropriately adjust the volume flow rates Q1 and Q2. Further, with respect to the volume flow rate of the gas discharged from each exhaust port, a measurement hole may be provided in the exhaust duct connected to each exhaust port, an anemometer may be inserted therein, and the volume flow rate of the gas may be calculated from the obtained measured value of the wind speed and the cross-sectional area of the exhaust duct. The position of the measurement hole provided in the exhaust duct 7 is preferably immediately after each exhaust port, but in the case where heat retention measures are taken by providing a heat insulating material in the exhaust duct so that the temperature change from the temperature of the gas at the exhaust port is substantially zero, the volume flow rate may be determined by providing the measurement hole at a position away from the exhaust port on the downstream side.

Furthermore, in order to minimize sticking and accumulation of the tar component, it is preferable that the first exhaust and the second exhaust be performed at positions where the temperature in the heat treatment chamber is 350 to 550° C., that is, the first and second exhaust ports be provided at positions where the temperature in the heat treatment chamber is 350 to 500° C. in the longitudinal direction of the heat treatment chamber. Since the pyrolysis of the stabilized fiber bundle 2 rapidly proceeds in the temperature range described above, and the decomposition gas containing the tar component is significantly generated in the range, discharge to the outside of the heat treatment chamber 3 can be performed immediately near the place where the tar component is generated, and the sticking of the tar component to the inside of the heat treatment chamber 3 can be further reduced.

At this time, for the temperature measurement in the heat treatment chamber, for example, a non-combustible rope such as a wire to which a temperature sensor such as a sheathed thermocouple is tied may be stretched in the heat treatment chamber to adjust the position of the exhaust port to be in the above-described temperature range.

Next, FIG. 3 shows another embodiment of the present invention, and in FIG. 3, first exhaust ports 9 are provided at two locations on the upper surface of the heat treatment chamber 3 in non-traveling regions 13 of the stabilized fiber bundle. The non-traveling region of the stabilized fiber bundle means a region where the stabilized fiber bundle is not traveling in the heat treatment chamber 3, that is, a region in the heat treatment chamber where the stabilized fiber bundle cannot be observed from the upper surface to the lower surface when the heat treatment chamber is seen through from the upper surface to the lower surface, and for example, the non-traveling region refers to a region surrounded between one end of the traveling stabilized fiber bundle 2 and the side wall of the heat treatment chamber 3 in the width direction in the heat treatment chamber 3 and between the bottom surface and the upper surface of the heat treatment chamber 3 in the height direction as illustrated in FIG. 3. With such a configuration, even when the tar component adheres to and accumulates on the inner walls of the first exhaust ports 9 and each exhaust duct, the tar component does not fall onto the traveling stabilized fiber bundle 2, which can prevent troubles such as an increase in fuzz and occurrence of yarn breakage as well as deterioration in physical properties.

In addition, the first exhaust ports 9 and a second exhaust port 10 are not necessarily provided on the upper surface and the bottom surface of the heat treatment chamber 3, respectively, but are only required to be provided at a position higher and a position lower than the uppermost tier of the stabilized fiber bundle 2, respectively. Therefore, for example, as illustrated in FIG. 4, either the first exhaust ports 9 or the second exhaust port 10 may be provided on the side surface of the heat treatment chamber 3, or both may be provided on the side surface of the heat treatment chamber 3. The effect of the present invention does not change at all even in such cases.

Next, although FIG. 5 shows another embodiment of the present invention, in FIG. 5, an additional inert gas supply port 12 for supplying an inert gas vertically upward is provided to the bottom surface of the heat treatment chamber between the inert gas supply port 5 on the inlet side and the first and second exhaust ports in the longitudinal direction of the heat treatment chamber 3. Although the first and second exhaust ports are provided at the same position in the longitudinal direction of the heat treatment chamber 3 in FIG. 5, when the first and second exhaust ports are provided at different positions in the longitudinal direction, the additional inert gas supply port 12 is provided at a position between the inert gas supply port 5 on the inlet side and the exhaust port closest to the inlet side among the first and second exhaust ports. FIG. 6 is a cross-sectional view taken along the line C-C of FIG. 5 as viewed in the direction of the arrows. Since the additional inert gas supply port 12 is provided at the center of the bottom surface of the heat treatment chamber 3, and the stabilized fiber bundle 2 is configured to travel while avoiding immediately above the additional inert gas supply port 12, a circulation flow path in the cross section as indicated by the arrows in the drawing is formed in the cross section. With this circulation flow path, it is possible to prevent the exhaust gas containing the tar component flowing from the outlet side from passing by the exhaust port 6 and flowing into the inlet side having a low temperature, thereby suppressing the sticking of the tar component. The method for forming such a circulation flow path in the cross section is not limited to the configuration illustrated in FIG. 6, and the additional inert gas supply port 12 may be provided on the side surface or the upper surface of the heat treatment chamber 3 as illustrated in FIG. 7. However, in order to prevent the sticking and accumulating tar component from falling onto the stabilized fiber bundle 2, it is preferable to provide the additional inert gas supply port 12 on the bottom surface or the side surface of the heat treatment chamber 3 and supply the additional inert gas.

In addition, when the cross-sectional area of the heat treatment chamber 3 along a plane parallel to the plane orthogonal to the traveling direction of the stabilized fiber bundle 2 at the position where the additional inert gas supply port 12 is present is denoted by S, and the volume flow rate of the inert gas supplied from the additional inert gas supply port 12 is denoted by V, it is more preferable to satisfy Formula (3) below.

$$0.1 \leq V/S \leq 0.4 [m/s] \quad \quad \text{Formula (3)}.$$

When V/S is less than 0.1, a sufficient circulation flow path for preventing exhaust gas containing the tar component flowing from the outlet side is not formed, and when V/S exceeds 0.4, vibration of the stabilized fiber bundle 2 occurs due to the flow of the circulation flow, and the contact frequency between adjacent fiber bundles increases, so that fiber bundle mixing and single yarn breakage may occur. With respect to the volume flow rate V of the inert gas supplied from the additional inert gas supply port 12, for example, the wind speed in the duct may be measured from a measurement hole provided in the duct connected to the additional inert gas supply port 12 with an anemometer, and the volume flow rate V may be calculated from the measured value of the wind speed and the cross-sectional area of the duct. For example, the cross-sectional area S of the heat treatment chamber 3 in the traveling direction of the stabilized fiber bundle 2 is h× b when the cross section is rectangular and the height of the heat treatment chamber 3 is h and the width is b as shown in FIG. 5, and the volume flow rate V in the case of other shapes may be appropriately calculated. The position of the measurement hole provided in the duct connected to the additional inert gas supply port 12 is preferably immediately before the additional inert gas supply port 12, but in the case where heat retention measures are taken by providing a heat insulating material in the duct so that the temperature change from the temperature of the gas at the additional inert gas supply port 12 is substantially zero, the volume flow rate may be determined by providing the measurement hole at a position away from the additional inert gas supply port 12 on the upstream side.

The precarbonized fiber bundle produced by the production method and in the precarbonization furnace is subjected to a carbonization treatment at a maximum temperature of 1,000 to 2,000° C. in an inert gas to produce a carbon fiber bundle. At this time, in order to improve the mechanical properties of the carbon fiber bundle, it is preferable to perform the carbonization treatment at a maximum temperature of 1,200 to 2,000° C. in an inert gas. As the inert gas filling the inside of the carbonization furnace, a known inert gas such as nitrogen, argon, and helium can be employed, but nitrogen is preferable from the viewpoint of economic efficiency.

A sizing agent may be applied to the carbon fiber bundle thus obtained in order to improve handleability and affinity with a matrix resin. The type of the sizing agent is not particularly limited as long as desired properties can be obtained, and examples thereof include sizing agents containing an epoxy resin, a polyester resin, an epoxy-modified polyurethane resin, or a polyester resin as a main component. A known method can be used to apply the sizing agent.

Further, the carbon fiber bundle may be subjected to an electrolytic oxidation treatment or an oxidation treatment for the purpose of improving affinity with a fiber-reinforced composite material matrix resin and adhesiveness thereto, if necessary.

The acrylic fiber bundle used as the stabilized fiber bundle, which is a fiber bundle to be heat-treated, of the present invention is preferably made of acryl fibers of 100-mol % acrylonitrile or acryl copolymer fibers containing 90 mol % or more of acrylonitrile. The fineness of the single fibers constituting the fiber bundle to be heat-treated is not particularly limited but is preferably 0.05 to 0.22 tex, more preferably 0.05 to 0.17 tex. A copolymerization component in the acryl copolymer fiber is preferably acrylic acid, methacrylic acid, itaconic acid, alkali metal salts thereof, ammonium metal salts, acrylamide, methyl acrylate, and the like, but the chemical properties, physical properties, dimensions, and the like of the acrylic fiber bundle are not particularly limited.

EXAMPLES

Hereinafter, the present invention will be described more specifically with reference to the drawings by way of examples, but the present invention is not limited thereto.

The volume flow rate Q1 of the gas in the first exhaust and the volume flow rate Q2 of the second gas were evaluated as follows.

First, using a high-temperature anemometer Anemomaster Model 6162 manufactured by Kanomax Japan Inc., in the first exhaust duct and the second exhaust duct, a probe was inserted from wind speed holes provided 0.5 m downstream from the first and second exhaust ports, and the wind speed of the gas of the exhaust was measured. The measurement was performed at 7 measurement points including the center of the duct, and the average value of a total of 30 values measured every 1 second was calculated at each measurement point and taken as the wind speed (m/s) of the gas in the first exhaust or the gas in the second exhaust. In addition, the cross-sectional areas ($m^2$) of the first exhaust duct and the second exhaust duct were measured. A value obtained by multiplying the obtained wind speed by the cross-sectional area of the exhaust duct was defined as the volume flow rate ($m^3$/s) of the gas in the exhaust. The volume flow rate of the gas in the first exhaust was indicated by Q1, and the volume flow rate of the second gas was indicated by Q2. The first exhaust duct and the second exhaust duct were provided with a heat insulating material to take measures so that there was no temperature change in the gas discharged from the first and second exhaust ports. V/S was determined as follows.

First, using a high-temperature anemometer Anemomaster Model 6162 manufactured by Kanomax Japan Inc., in the duct connected to the additional inert gas supply port 12, a probe was inserted from the wind speed hole provided 0.5 m upstream from the additional inert gas supply port 12, and the wind speed of the supplied gas was measured. The measurement was performed at 7 measurement points including the center of the duct, and the average value of a total of 30 values measured every 1 second was calculated at each measurement point and taken as the wind speed (m/s) of the gas supplied from the additional inert gas supply port 12. In addition, the cross-sectional area ($m^2$) of the duct connected to the additional inert gas supply port 12 was measured. A value obtained by multiplying the obtained wind speed by the cross-sectional area of the duct was defined as the volume flow rate V ($m^3$/s) of the inert gas supplied from the additional inert gas supply port 12. The duct connected to the additional inert gas supply port 12 was provided with a heat insulating material to take measures so that there was no temperature change in the gas supplied from the additional inert gas supply port 12. The obtained volume flow rate V of the inert gas supplied from the additional inert gas supply port 12 was divided by the cross-sectional area S of the heat treatment chamber 3 to obtain V/S.

The quality criteria in examples and comparative examples were as follows.

A: A level at which the number of fuzzes of 10 mm or more on the fiber bundle that can be visually confirmed after the fiber bundle exits the precarbonization process is less than 5/m on average, and the fluff quality does not affect the passability in the process and the high-order processability as a product at all.

B: A level at which the number of fuzzes of 10 mm or more on the fiber bundle that can be visually confirmed after the fiber bundle exits the precarbonization process is 5/m or more and 10/m or less on average, and the fluff quality has almost no influence on the passability in the process and the high-order processability as a product.

C: A level at which the number of fuzzes of 10 mm or more on the fiber bundle that can be visually confirmed after the fiber bundle exits the precarbonization process is more than 10/m on average, and the fluff quality adversely affects the passability in the process and the high-order processability as a product.

Example 1

Stabilized fiber bundles obtained by heat-treating 100 aligned acrylic fiber bundles each composed of 20,000 single fibers having a single fiber fineness of 0.11 tex at 240 to 280° C. in air was continuously passed through a precarbonization furnace that was retained at a maximum temperature of 700° C. and had the shape as shown in FIG. 1 and an effective heat treatment length of 4 m at a yarn speed of 1.0 m/min to provide precarbonized fiber bundles. As an inert gas filling the inside of the heat treatment chamber 3, nitrogen was supplied from the inert gas supply ports 5 provided on the inlet side and the outlet side, and the first exhaust port 9 and the second exhaust port 10 were provided at a position where the temperature in the furnace was around 450° C. to perform exhaust. For measuring the temperature in the furnace, a wire to which a sheathed thermocouple (OKAZAKI "AEROPAK (registered trademark)", sheath outer diameter 1.6 mm) was tied was stretched in the furnace to adjust the positions of the exhaust ports to the above temperature. As illustrated in FIG. 2, the first exhaust port 9 was provided on the upper surface of the heat treatment chamber 3, the second exhaust port 10 was provided on the bottom surface of the heat treatment chamber 3, and the regulating valve 11 (damper) for adjusting an exhaust flow rate was provided in the exhaust duct 7 connected to each exhaust port. The exhaust flow rate was measured using a high-temperature anemometer Anemomaster Model 6162 manufactured by Kanomax Japan Inc. by inserting a probe through the wind speed hole provided in each exhaust duct. The measurement was performed at 7 measurement points including the center of the duct, and the average value of a total of 30 values measured every 1 second was calculated at each measurement point and taken as the wind speed. Then, the exhaust flow rate was calculated from the obtained measured value of the wind speed and the cross-sectional area of the exhaust duct.

The obtained precarbonized fiber bundles were then fired at a maximum temperature of 1,400° C. in a carbonization furnace, and a sizing agent was applied after electrolytic surface treatment to obtain carbon fiber bundles.

At this time, the damper opening degree of each exhaust duct was adjusted so that the flow rate ratio Q2/Q1 between the volume flow rate Q1 of the gas discharged from the first exhaust port 9 and the volume flow rate Q2 of the gas discharged from the second exhaust port 10 would be 0.5. Even after continuous operation for 10 days under the above conditions, yarn breakage of the stabilized fiber bundles 2, clogging in the exhaust ducts, and the like did not occur, and continuous operation was possible. Then, the inside of the furnace was visually checked after the end of the operation, and it was confirmed that a small amount of the tar component stuck to the inner wall of the heat treatment chamber at a level that there was no problem in the operation. In addition, the obtained precarbonized fiber bundles and carbon fiber bundles were visually checked, and the result showed that the quality was good with less fuzz or the like.

Example 2

The procedure similar to that of Example 1 was carried out except that Q2/Q1 was changed to 0.3. Even after continuous operation for 10 days under the above conditions, yarn breakage of the stabilized fiber bundles 2, clogging in the exhaust ducts, and the like did not occur, and continuous operation was possible. Then, the inside of the furnace was visually checked after the end of the operation, but sticking of the tar component was not observed, and it was confirmed that the operation for 10 days or more was possible. In addition, the obtained precarbonized fiber bundles and carbon fiber bundles were visually checked, and the result showed that the quality was extremely good without fuzz or the like.

Example 3

The procedure similar to that of Example 1 was carried out except that Q2/Q1 was changed to 0.4. Even after continuous operation for 10 days under the above conditions, yarn breakage of the stabilized fiber bundles 2, clogging in the exhaust ducts, and the like did not occur, and continuous operation was possible. Then, the inside of the furnace was visually checked after the end of the operation, and it was confirmed that a small amount of the tar component stuck to the inner wall of the heat treatment chamber at a level that there was no problem in the operation. In addition, the obtained precarbonized fiber bundles and carbon fiber bundles were visually checked, and the result showed that the quality was good with less fuzz or the like.

Example 4

An additional inert gas supply port 12 was provided at the center of the bottom surface of the heat treatment chamber 3 between the inert gas supply port 5 on the inlet side and the exhaust ports as shown in FIGS. 5 and 6, and nitrogen was supplied. The procedure similar to that of Example 1 was carried out except that V/S was set to 0.2 m/s where S represents the cross-sectional area of the heat treatment chamber in the traveling direction of the stabilized fiber bundles 2, and V represents the volume flow rate of the additional inert gas. Even after continuous operation for 10 days under the above conditions, yarn breakage of the stabilized fiber bundles 2, clogging in the exhaust ducts, and the like did not occur, and continuous operation was possible. Then, the inside of the furnace was visually checked after the end of the operation, but sticking of the tar component was not observed, and it was confirmed that the operation for 10 days or more was possible. In addition, the obtained precarbonized fiber bundles and carbon fiber bundles were visually checked, and the result showed that the quality was extremely good without fuzz or the like.

Example 5

The procedure similar to that of Example 1 was carried out except that Q2/Q1 was changed to 0.01. Even after continuous operation for 10 days under the above conditions, yarn breakage of the stabilized fiber bundles 2, clogging in the exhaust ducts, and the like did not occur, and continuous operation was possible. Then, the inside of the furnace was visually checked after the end of the operation, but sticking of the tar component was not observed, and it was confirmed that the operation for 10 days or more was possible. In addition, the obtained precarbonized fiber bundles and carbon fiber bundles were visually checked, and the result showed that the quality was extremely good without fuzz or the like.

Example 6

The procedure similar to that of Example 4 was carried out except that V/S was changed to 0.6 m/s. Even after continuous operation for 10 days under the above conditions, yarn breakage of the stabilized fiber bundles 2, clogging in the exhaust ducts, and the like did not occur, and continuous operation was possible. Then, the inside of the furnace was visually checked after the end of the operation, but sticking of the tar component was not observed, and it was confirmed that the operation for 10 days or more was possible. In addition, the obtained precarbonized fiber bundles and carbon fiber bundles were visually checked, and the result showed that the quality was good with less fuzz or the like.

Example 7

The procedure similar to that of Example 4 was carried out except that V/S was changed to 0.03 m/s. Even after continuous operation for 10 days under the above conditions, yarn breakage of the stabilized fiber bundles 2, clogging in the exhaust ducts, and the like did not occur, and continuous operation was possible. Then, the inside of the furnace was visually checked after the end of the operation, and it was confirmed that a small amount of the tar component stuck to the inner wall of the heat treatment chamber at a level that there was no problem in the operation. In addition, the obtained precarbonized fiber bundles and carbon fiber bundles were visually checked, and the result showed that the quality was good with less fuzz or the like.

Comparative Example 1

The procedure similar to that of Example 1 was carried out except that Q2/Q1 was changed to 0.6. Under the above conditions, clogging of the exhaust duct occurred about 5 hours after the start of fiber bundle passage, and continuous operation became impossible. Then, when the inside of the furnace was visually checked after the end of the operation, it was confirmed that a large amount of the tar component stuck and accumulated on the inner wall of the heat treatment chamber. In addition, the obtained precarbonized fiber bundles and carbon fiber bundles were visually checked, and the result showed that there were many fuzzes and the like, and the quality was poor.

Comparative Example 2

The procedure similar to that of Example 1 was carried out except that Q2/Q1 was changed to 0, that is, only exhaust from the upper surface of the heat treatment chamber 3 was used. Under the above conditions, since yarn breakage frequently occurred in the stabilized fiber bundles 2 from the second day from the start of the fiber bundle passage, the operation was stopped. Then, when the inside of the furnace was visually checked after the operation was stopped, a large amount of the tar component stuck to the inner wall of the heat treatment chamber, and cleaning was required. In addition, the obtained precarbonized fiber bundles and carbon fiber bundles were visually checked, and the result showed that there were many fuzzes and the like, and the quality was poor.

TABLE 1

| | Equipment conditions | | | Operating conditions | | | Continuous | | | |
|---|---|---|---|---|---|---|---|---|---|---|
| | Effective heat treatment length [m] | Maximum temperature in furnace [° C.] | Yarn speed [m/min] | Q2/Q1 [—] | Additional inert gas supply port | V/S [m/s] | operation days [days] | Sticking of tar component | Exhaust duct clogging | Quality |
| Example 1 | 4 | 700 | 1.0 | 0.5 | Absent | — | 10 | Little | None | B |
| Example 2 | 4 | 700 | 1.0 | 0.3 | Absent | — | 10 | None | None | A |
| Example 3 | 4 | 700 | 1.0 | 0.4 | Absent | — | 10 | Little | None | B |
| Example 4 | 4 | 700 | 1.0 | 0.5 | Present | 0.2 | 10 | None | None | A |
| Example 5 | 4 | 700 | 1.0 | 0.01 | Absent | — | 10 | None | None | A |
| Example 6 | 4 | 700 | 1.0 | 0.5 | Present | 0.6 | 10 | None | None | B |
| Example 7 | 4 | 700 | 1.0 | 0.5 | Present | 0.03 | 10 | Little | None | B |
| Comparative Example 1 | 4 | 700 | 1.0 | 0.6 | Absent | — | 0 | Much | Observed | C |
| Comparative Example 2 | 4 | 700 | 1.0 | 0 | Absent | — | 2 | Much | None | C |

The present invention can be suitably used for production of a precarbonized fiber bundle and carbon fiber bundle, and the stabilized fiber bundle and carbon fiber bundle obtained by the present invention can be suitably applied to aircraft applications, industrial applications such as pressure vessels and windmills, sports applications such as golf shafts, and the like, but the application range is not limited thereto.

DESCRIPTION OF REFERENCE SIGNS

1: Precarbonization furnace
2: Stabilized fiber bundle
3: Heat treatment chamber
4: Slit-shaped opening
5: Inert gas supply port
6: Exhaust port
7: Exhaust duct
8: Combustion or exhaust gas treatment device
9: First exhaust port 10: Second exhaust port
11: Regulating valve
12: Additional inert gas supply port
13: Non-traveling region of stabilized fiber bundle
Q1: Volume flow rate of gas discharged from first exhaust port
Q2: Volume flow rate of gas discharged from second exhaust port
h: Height of heat treatment chamber
b: Width of heat treatment chamber

The invention claimed is:

1. A production method for a precarbonized fiber bundle, comprising:
   allowing a stabilized fiber bundle aligned along a horizontal plane and vertically arranged in one or two or more tiers to travel horizontally in a heat treatment chamber; and
   heat-treating and precarbonizing the stabilized fiber bundle at a maximum temperature of 300 to 1,000° C. using an inert gas supplied from an inlet side and an outlet side of the heat treatment chamber,
   wherein a flow rate ratio Q2/Q1 satisfies Formula (1) below, where Q1 represents a volume flow rate of gas in a first exhaust discharged out of the heat treatment chamber from a position higher than a position of an uppermost tier of the traveling stabilized fiber bundle, and Q2 represents a volume flow rate of gas in a second exhaust discharged out of the heat treatment chamber from a position lower than the uppermost tier of the traveling stabilized fiber bundle:

$$0.01 \leq Q2/Q1 \leq 0.5 \qquad \text{Formula (1).}$$

2. The production method for a precarbonized fiber bundle according to claim 1, wherein the flow rate ratio Q2/Q1 between the volume flow rate Q1 of the gas in the first exhaust and the volume flow rate Q2 of the gas in the second exhaust satisfies Formula (2) below in precarbonization:

$$0.01 \leq Q2/Q1 \leq 0.3 \qquad \text{Formula (2).}$$

3. The production method for a precarbonized fiber bundle according to claim 1, wherein the first exhaust and the second exhaust are performed at a position where a temperature in the heat treatment chamber is 350 to 550° C.

4. The production method for a precarbonized fiber bundle according to claim 1, wherein the first exhaust is performed in a non-traveling region of the stabilized fiber bundle.

5. The production method for a precarbonized fiber bundle according to claim 1, wherein when viewed in a longitudinal direction of the heat treatment chamber, an additional inert gas is supplied from a position between a position where the inert gas is supplied from the inlet side and a position closest to the inlet side selected from a position where the first exhaust is performed and a position where the second exhaust is performed, the position being on a bottom surface or a side surface of the heat treatment chamber.

6. The production method for a precarbonized fiber bundle according to claim 5,
   wherein Formula (3) below is satisfied, where S represents a cross-sectional area of the heat treatment chamber in a traveling direction of the stabilized fiber bundle, and V represents a supply volume flow rate of the additional inert gas:

$$0.1 \leq V/S \leq 0.4 [m/s] \qquad \text{Formula (3).}$$

7. A production method for a carbon fiber bundle, comprising subjecting a precarbonized fiber bundle obtained by the production method for a precarbonized fiber bundle according to claim 1 to a carbonization treatment at a maximum temperature of 1,000 to 2,000° C. in an inert gas.

* * * * *